United States Patent

Chuang et al.

[11] Patent Number: 5,895,240
[45] Date of Patent: Apr. 20, 1999

[54] METHOD OF MAKING STEPPED EDGE STRUCTURE OF AN EEPROM TUNNELING WINDOW

[75] Inventors: Kuen-Joung Chuang, Peng-Hu; Ming-Chih Chung, Hsin-Chu; Jyh-Feng Lin, Hua-Lian, all of Taiwan

[73] Assignee: Taiwan Semiconductor Manufacturing Company, Ltd., Hsin-Chu, Taiwan

[21] Appl. No.: 08/884,916

[22] Filed: Jun. 30, 1997

[51] Int. Cl.⁶ .................................. H01L 21/8247
[52] U.S. Cl. ............................... 438/260; 438/264
[58] Field of Search .......................... 438/259, 260, 438/264, 589, 762, 763

[56] References Cited

U.S. PATENT DOCUMENTS

| | | | |
|---|---|---|---|
| 5,352,618 | 10/1994 | Larsen et al. | 437/43 |
| 5,393,684 | 2/1995 | Ghezzi et al. | 438/264 |
| 5,504,022 | 4/1996 | Nakanishi et al. | 438/260 |
| 5,534,455 | 7/1996 | Liu | 437/43 |
| 5,750,428 | 5/1998 | Chang | 438/264 |
| 5,773,343 | 6/1998 | Lee et al. | 438/259 |

Primary Examiner—Chandra Chaudhari
Attorney, Agent, or Firm—George O. Saile; Stephen B. Ackerman; William J. Stoffel

[57] ABSTRACT

The present invention provides a structure and a method of forming a stepped trench oxide structure for a semiconductor memory device. The stepped trench oxide structure has "oxide steps" (e.g., 252 or 34A, 34B, 34C) in the gate oxide 20 surrounding the tunnel oxide layer 30. The oxide steps 34 are formed where the oxide thinning effect normally thins the tunnel oxide 30 around the perimeter of the tunnel oxide layer 30. The oxide steps 34 252 compensate for the oxide thinning effect and eliminate the problems associated with the oxide thinning effects. The oxide steps are preferably formed using one photo mask to form two different sized openings using different photoresist exposure times. The preferred method comprises forming a first tunneling opening 220A in a first (gate) oxide layer 220. Then, forming a second oxide layer 250 over said exposed substrate and said first oxide layer 220. A second opening 250A (smaller than the first opening) is formed in the second oxide layer thereby forming a first step 252. Next, a third oxide layer 270 is formed over said exposed substrate, the first oxide layer 220 and the second oxide layer 250 thereby propagating the first step 252. The oxide thinning edge effect is eliminated by the first step.

15 Claims, 9 Drawing Sheets

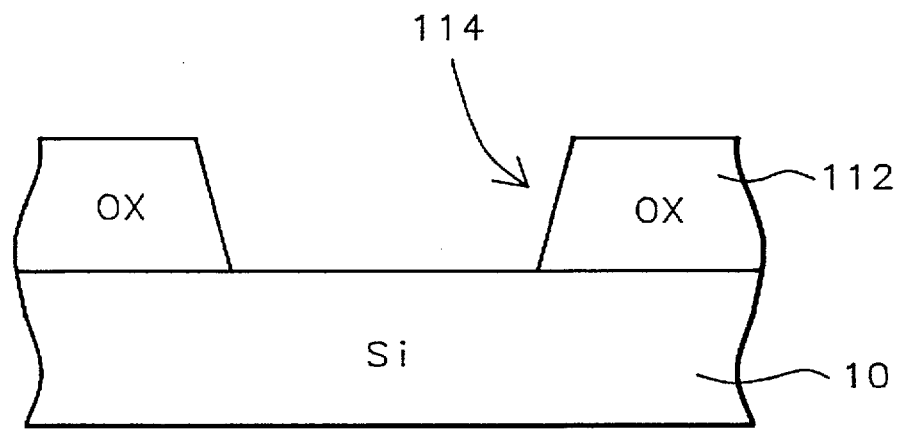
FIG. 1 — Prior Art
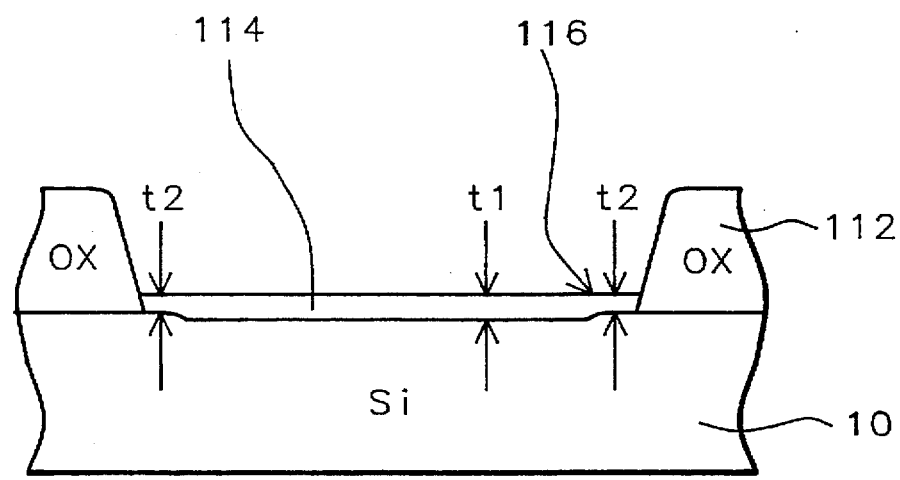
FIG. 2 — Prior Art

METHOD OF MAKING STEPPED EDGE STRUCTURE OF AN EEPROM TUNNELING WINDOW

FIELD OF THE INVENTION

This invention relates generally to the structure and a fabrication method of a semiconductor memory device and more particularly to structure and method of fabrication for a tunnel oxide layer in a semiconductor memory device.

DESCRIPTION OF THE PRIOR ART

In metal oxide semiconductor (MOS) electrically erasable, programmable read only memory (EEPROM) transistors, electron tunnel through very thin silicon dioxide ($SiO_2$, "oxide") layer to be stored on or removed from a storage location, known as a floating gate. The area of the thin dielectric layer through which electron tunneling occurs is limited to small generally rectangular dimensions and the thinness of the layer is carefully controlled. U.S. Pat. No. 5,352,618 (Larson et al.) describes formation of a thin tunnel oxide.

We have found a tunnel oxide edge thinning problem when using conventional methods of forming tunnel oxide layers. As shown in FIG. 1, an opening 114 for a tunnel oxide layer is formed in an oxide layer 112 over a substrate 10. As shown in FIG. 2, the exposed substrate is oxidized to form the tunnel oxide layer 114. However, the tunnel oxide layer 114 has thin area 116 around the perimeter where the tunnel oxide layer is thinner than the normal tunnel oxide layer in the middle. T1 represents the normal thickness of the tunnel oxide layer 114, which is preferably between about 65 and 105 Å. T2 is the thickness of the thin tunnel oxide around the perimeter that has a thickness in a range of between about 50 and 90 Å. The thin oxide 116 causes the following problems: higher tunneling gate leakage, charge trapping, interface state formation, charge damage and antenna effect induce oxide damage. These problems lower the yield on semiconductor memory devices. The tunnel oxide edge thinning effect is thought to be caused by the oxygen flow/diffuse patterns around the edge.

Others have developed tunnel oxide processes. For example, U.S. Pat. No. 5,534,455 (Liu) shows a method for protecting the tunnel oxide near the edge of a gate. The method uses a spacer and a SAS (self-aligned source). U.S. Pat. No. 5,352,618 (Larsen) shows a method of making a tunneling window where a mask edge overlying the oxide layer is undercut a small distance and a thing layer of oxide is formed in the under cut distance to serve as a tunneling window.

There is still a need for a method and structure of tunnel oxide that reduces or eliminates the oxide edge thinning effect.

SUMMARY OF THE INVENTION

It is an objective of the present invention to provide a structure and method for forming a tunneling oxide layer that has oxide steps on its perimeter that reduce the oxide edge thinning problem.

It is an objective of the present invention to provide a structure and a method for forming memory device having a tunneling oxide structure that has steps around it's perimeter that reduces the oxide edge thinning problem.

To accomplish the above objectives, the present invention provides a structure and a method of forming a stepped trench oxide structure for a semiconductor memory device.

The stepped trench oxide structure has "oxide steps" in the gate oxide surrounding the tunnel oxide layer. The oxide steps 34 are formed where the oxide thinning effect normally thins the tunnel oxide 30 and around the perimeter. The oxide steps 252 34 compensate for the oxide thinning effect and eliminate the problems associated with the oxide thinning effects.

The method of fabricating a stepped tunnel oxide structure for a memory device has several embodiments. In a first embodiment shown in FIGS. 8A though 8E, oxide layers are etched and regrown to create a first step 252 34A or N-steps. The first embodiment can be summarized as a method of fabricating a tunnel oxide layer for a memory device; comprising the steps of:

a) See FIG. 8A, forming a first oxide layer 220 over a surface of a semiconductor substrate 10; the substrate having a channel region 14; the substrate having a tunneling region 12 surrounded by the channel region 14;

b) See FIG. 8B, forming a first photoresist layer 240 having a first photoresist opening over a portion of the channel region; the first photoresist opening defined by a first exposure through a first photolithography optical c) See FIG. 8B, etching a first portion of the first oxide layer through the first photoresist opening at least over the tunneling region exposing the substrate forming a first tunneling opening 220A;

d) See FIG. 8C, forming a second oxide layer 250 over the exposed substrate and the first oxide layer 220;

e) See FIG. 8D, forming a second photoresist layer 260 over the second oxide layer 250; the second photoresist layer 260 having a second photoresist opening 260A; the second photoresist opening is smaller than the first photoresist opening; the second photoresist opening exposing the tunneling region; the second photoresist opening is defined by a second exposure through the first photolithography optical mask; the second exposure is longer than the first exposure thereby the second photoresist opening is smaller than the first photoresist opening;

f) See FIG. 8D, etching the second oxide layer 250 through the second opening exposing the substrate surface and forming a first step 252;

g) See FIG. 8E, forming a third oxide layer 270 over the exposed substrate, the first oxide layer 220 and the second oxide layer 250; thereby propagating the first step and whereby the oxide thinning edge effect is eliminated by the first step.

In a second embodiment, the oxide steps are formed using a different photo process. Two oxide steps are formed in the gate oxide 20 surrounding the tunnel oxide 30. In a third embodiment, more than two steps (e.g., 34A, 34B, 34C, . . . 34N) are formed in the gate oxide layer 20 surrounding the tunnel oxide 30.

The second embodiment of the method where two steps are formed in the gate oxide layer comprises the steps of:

a) See figure 5a, forming a first oxide layer 20 over a surface of a semiconductor substrate 10; the substrate having a channel region 14;

b) forming a first photoresist layer 40 having a first photoresist opening 40a over a portion of the channel region 14;

c) etching a first portion of the first oxide layer 20 through the first photoresist opening forming a first tunneling opening defined by a first step 34A;

d) See FIG. 5B, forming a second photoresist layer 42 having a second photoresist opening 42A over a portion of the channel region 14; the second photoresist opening 42a having an open dimension larger than the first photoresist opening 40A;

e) See FIG. 5b, etching the first oxide layer 20 through a portion of the second photoresist opening 42A forming a second tunneling opening exposing the channel region and forming a second step 34B, the second tunneling opening having an open dimension larger than the first tunneling opening;

f) See FIG. 5c, oxidizing the substrate forming a tunnel oxide layer 30 over the channel region 14 whereby the oxide thinning edge effect is eliminated by the first step 34A.

The third embodiment of the method of the present invention is the formation of more than two oxide steps. The photoresist and etching processes in steps (d) and (e) can be repeated and desired number (n) of times to form a plurality of steps. The invention's stepped tunnel oxide structure can be describe as follows: The invention is a self-aligned flash memory MOS field effect transistor device comprising:

a) a silicon semiconductor substrate having an upper surface, b) a source region and a drain region formed in the substrate on the upper surface, a channel region between the source and drain regions; a tunneling region surrounded by the channeling region;

c) a gate oxide layer, a stepped tunnel oxide structure and a tunnel oxide layer formed over the surface of the substrate including the surface over the source and the drain regions, the gate oxide layer surrounding the stepped tunnel oxide structure; the stepped tunnel oxide structure surrounding the tunnel oxide layer;

d) the tunnel oxide structure comprising a tunnel oxide layer surrounded by a stepped tunnel oxide structure; the gate oxide layer having a thickness greater than the thickness of the tunnel oxide layer; the stepped tunnel oxide structure having n steps where n is between 1 and 5;

e) a gate structure composed of a stack formed upon the gate oxide layer, the stepped tunneling oxide structure and the tunneling oxide layer; and f) the stack comprising a floating gate electrode, a dielectric layer formed upon the floating gate electrode and a control electrode formed upon the dielectric layer.

The present invention provides a structure and a method of forming a stepped trench oxide structure for a semiconductor memory device. The stepped tunnel oxide structure can have 2 or more steps. The stepped trench oxide structure has "oxide steps" in the gate oxide surrounding the tunnel oxide where the oxide steps are formed where the oxide thinning effect normally thins the tunnel oxide. The oxide steps compensate for the oxide thinning effect and eliminate the problems associated with the oxide thinning effects.

The invention solves the following problems: tunneling gate leakage, charge trapping, surface state formation, charge damage and antenna effect induced oxide damage. These problems had lowered the yield on semiconductor memory devices using the prior art processes. In addition the invention reduces the charge loss and increase the charge gain.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 and 2 are cross sectional views for illustrating a conventional method for manufacturing tunnel oxide layer that has the oxide thin edge effect problem.

DETAILED DESCRIPTION OF THE PREFERRED EMBODIMENTS

The present invention will be described in detail with reference to the accompanying drawings. The present invention provides a structure and a method of forming a stepped trench oxide structure for a semiconductor memory device. The stepped trench oxide structure has "oxide steps" in the gate oxide surrounding the tunnel oxide where the oxide steps are formed where the oxide thinning effect normally thins the tunnel oxide. The oxide steps compensate for the oxide thinning effect and eliminate the problems associated with the oxide thinning effects.

The method of fabricating a stepped tunnel oxide structure for a memory device has several embodiments. In a first embodiment, oxide layers are etched and regrown to create the first step. The method of the first embodiment can be repeated to create more than one step. In a second embodiment, using a different photo process, two oxide steps 34A and 34B are formed in the gate oxide surrounding the tunnel oxide. In a third embodiment, more than two steps are formed in the gate oxide surrounding the tunnel oxide 30.

First Embodiment—One Optical Mask—Oxide Etch And Re-growth Process

Figure 8A:
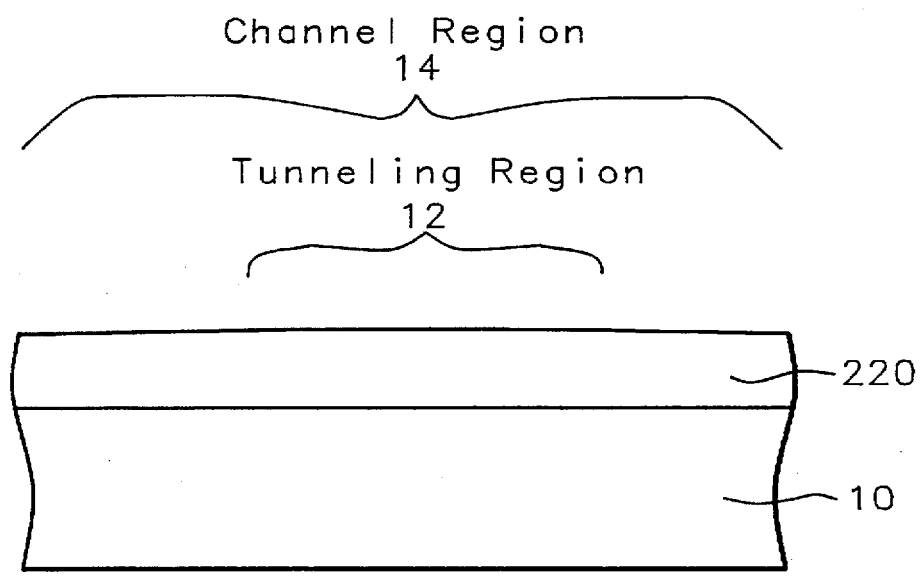
FIGS. 8A through 8E are cross sectional views, for illustrating the memory device having a step tunnel oxide structure according to the first embodiment of the present invention.

In a first embodiment shown in FIGS. 8A though 8E, oxide layers are etched and regrown to create a first step 252 or N-steps.

The first embodiment begins as shown in FIG. 8A by forming a first oxide layer 220 over a surface of a semiconductor substrate 10. The substrate has a channel region 14. The substrate has a tunneling region 12 surrounded by the channel region 14. The first oxide layer 220 preferably has thickness in a range of between about 25 and 150 Å and more preferably of about 100 Å.

Figure 8B:
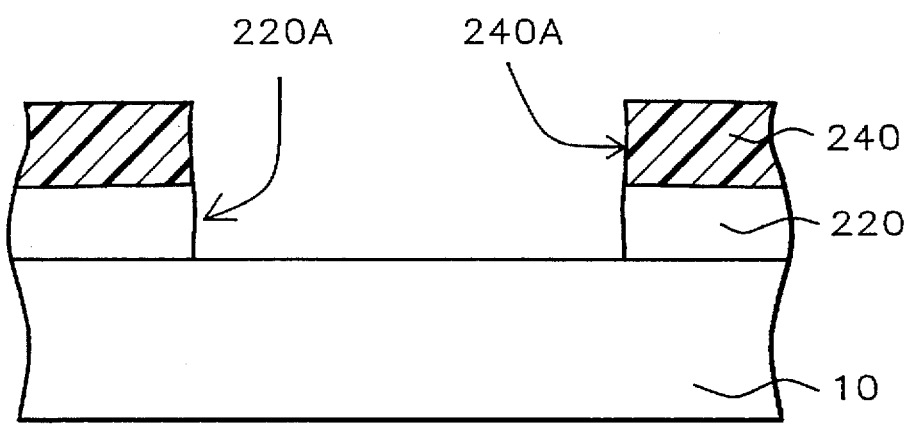

As shown in FIG. 8B, a first photoresist layer 240 is formed having a first photoresist opening 220A over a portion of the channel region. The first photoresist opening is formed using conventional photolithography techniques (e.g., align, expose, develop, etch, etc.) The first photoresist opening 240A is preferably defined by a first exposure through a first photolithography optical mask (i.e., tunnel window optical mask) (not shown).

As shown in FIG. 8B, the first oxide layer is etched through the first photoresist opening at least over the tunneling region 12 exposing the substrate and forming a first tunneling opening 220A.

Figure 8C:
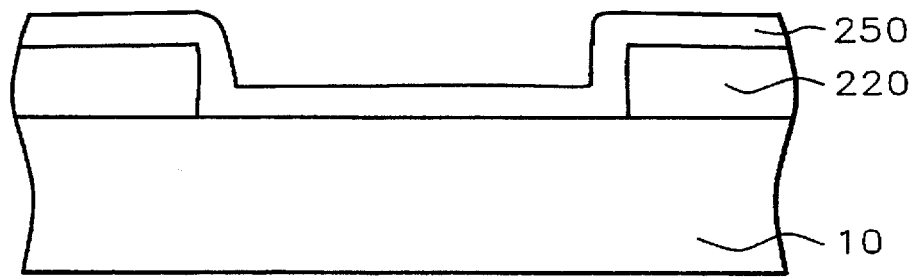

As shown in FIG. 8C, a second oxide layer 250 is formed over the exposed substrate and the first oxide layer 220. The second oxide layer 250 preferably has a thickness in a range of between about 25 and 75 Å and more preferably 50 Å.

Figure 8D:
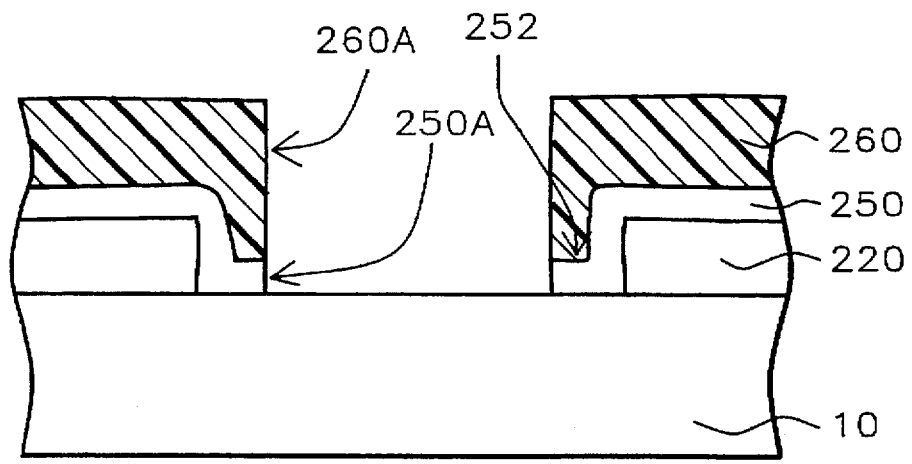

As shown in FIG. 8D, a second photoresist layer 260 is formed over the second oxide layer 250. The second photoresist layer 260 has a second photoresist opening 260A. The second photoresist opening 260A is smaller than the first photoresist opening. The second photoresist opening exposes the tunneling region 12.

The second photoresist opening 260A is preferably smaller than the first photoresist opening by a open dimension (e.g., distance) of between about 0.02 and 0.07 µm and more preferably about 0.05 µm.

The preferred method of forming the second photoresist opening 260A is by using the same first photolithography optical mask (i.e., tunnel window optical mask) and using a different exposure time/intensity to vary the size of the second photoresist opening 260A compared to the first photoresist opening 240A. The second photoresist opening 260A preferably is by defined by using a second exposure through the first photolithography optical mask. The second exposure is preferably longer than the first exposure thereby making the second photoresist opening 260A smaller than the first photoresist opening. Alternately, two different optical mask can be used.

Still referring to FIG. 8D, the second oxide layer 250 is etched through the second photoresist opening 260A forming a second oxide opening 250A and exposing the substrate surface and forming a first step 252.

Figure 8E:
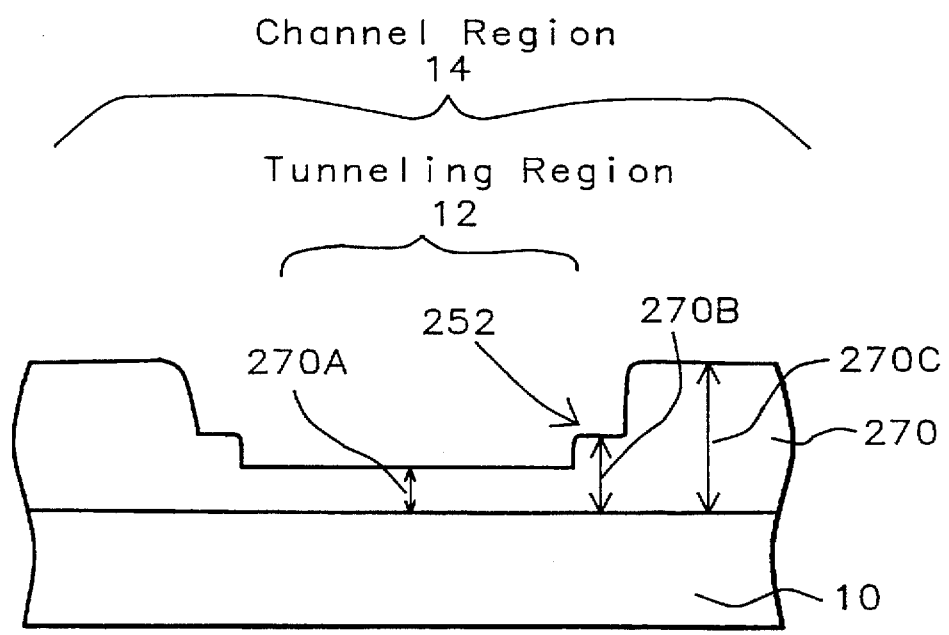

Turning to FIG. 8E, a third oxide layer 270 is formed over the exposed substrate, the first oxide layer 220 and the second oxide layer 250. This propagates the first step 252. The oxide thinning edge effect is eliminated by the first step. The third oxide layer 270 preferably has thickness 270A in a range of between about 40 and 125 Å and more preferably abut 105 Å. The first step has preferably a width in a range of between about 0.02 µm and 0.07 µm and more preferably about 0.05 µm. The first step preferably has a height 270B between about 115 and 155 Å and more preferably of about 125 Å.

Figure 7:
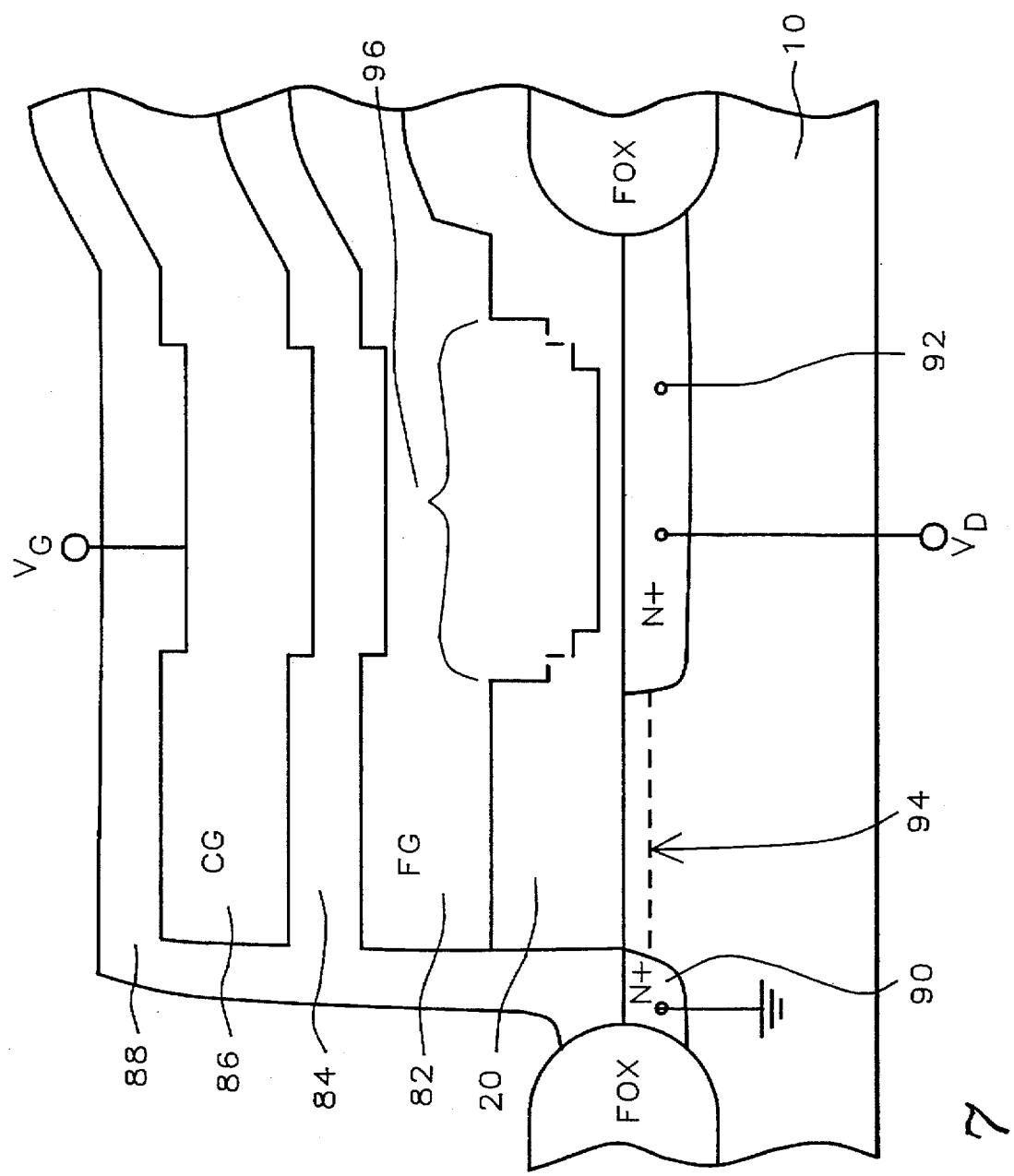
FIG. 7 is a cross sectional views, for illustrating the memory device having a step tunnel oxide structure according to the present invention.

The first step reduces or eliminates the problems associated with the thin oxide effects. Subsequently, the semiconductor device, such as a memory can be made by using conventional steps in forming a gate structure as shown in FIG. 7.

Figure 3:
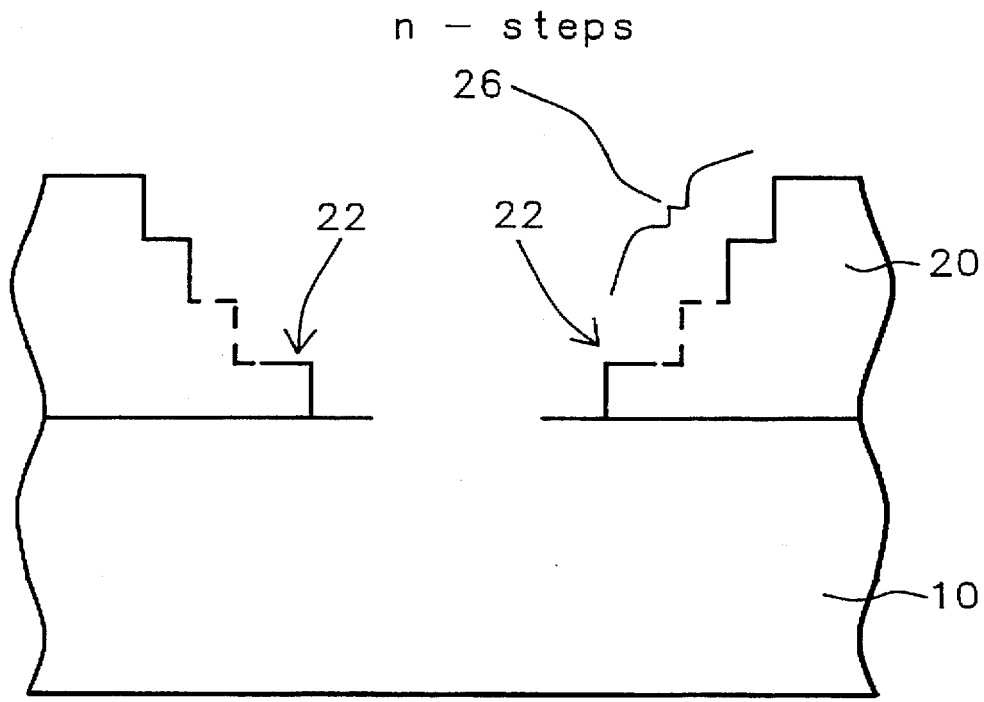
FIG. 3 is a cross sectional view taken along line 3' in FIG. 4, for illustrating a step tunnel oxide structure having 2 or more steps according to the present invention.
Figure 4:
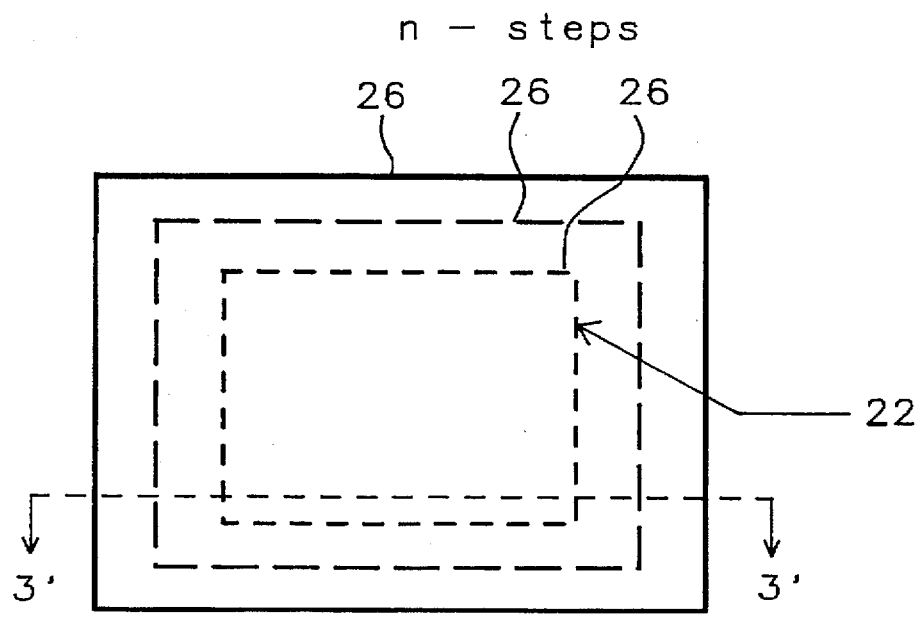
FIG. 4 is a top down view of the stepped tunnel oxide structure of the present invention.

The process of forming steps (e.g., 252 etc) as describe above (photo mask, & etch) can be repeated any number (n) of desired times and is more preferably repeated between 2 and 5 times. See FIG. 3. FIGS. 3 and 4 show an embodiment of the tunnel oxide steps of the invention having a desired "N" number of steps. FIG. 3 represents a tunnel oxide step structure 26. The structure of the present invention can have and desired number (n) of steps.

The first step of the series of steps is labeled 22 and the group of n steps is labeled 26 in FIGS. 3 and 4. FIG. 4 is a top down view of the tunnel oxide step structure of the invention.

Second Embodiment—2 Photo Mask Method

Figure 5A:
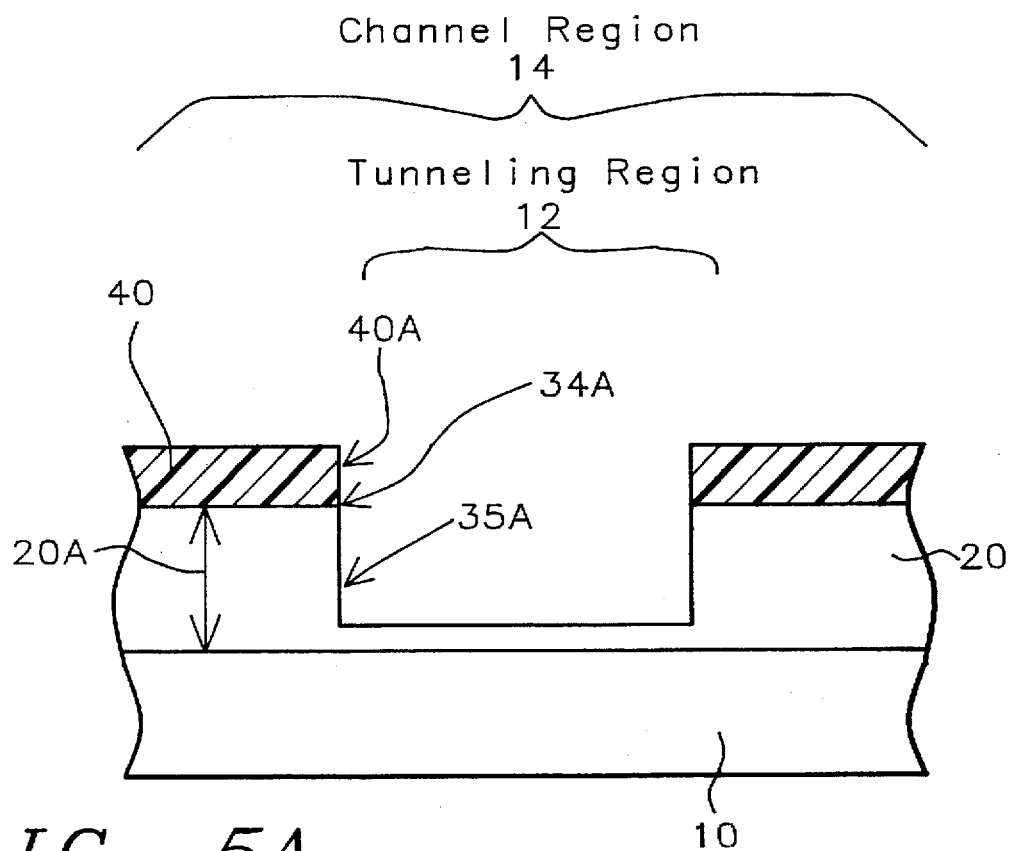
FIGS. 5A–5C are cross sectional views, for illustrating a step tunnel oxide structure having 2 steps according to the second embodiment present invention.
Figure 5B:
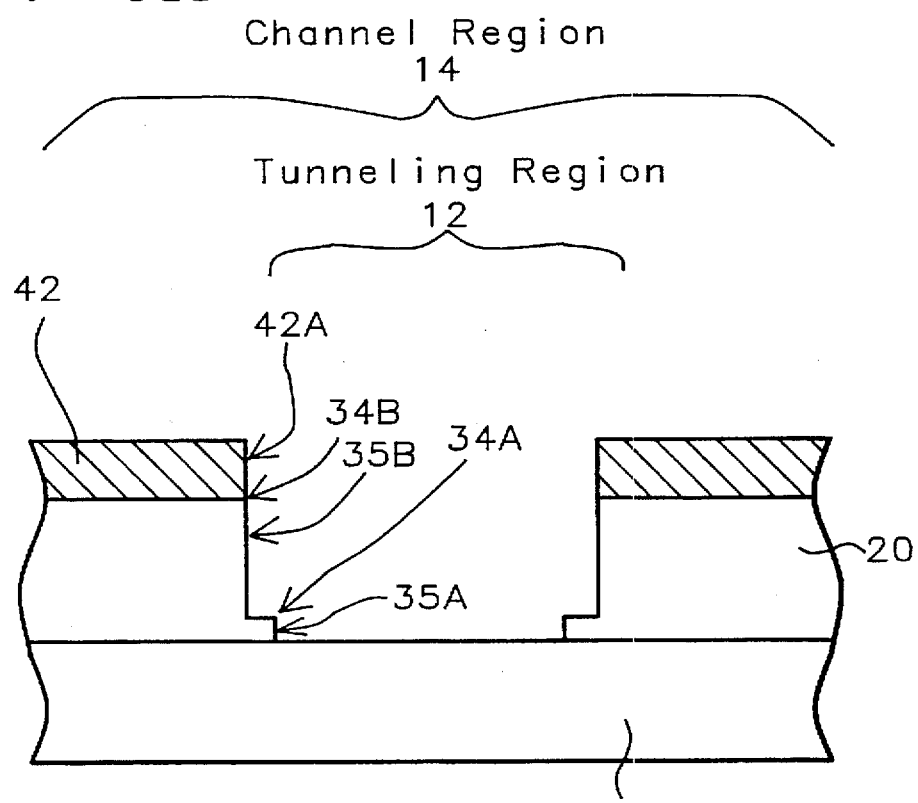
Figure 5C:
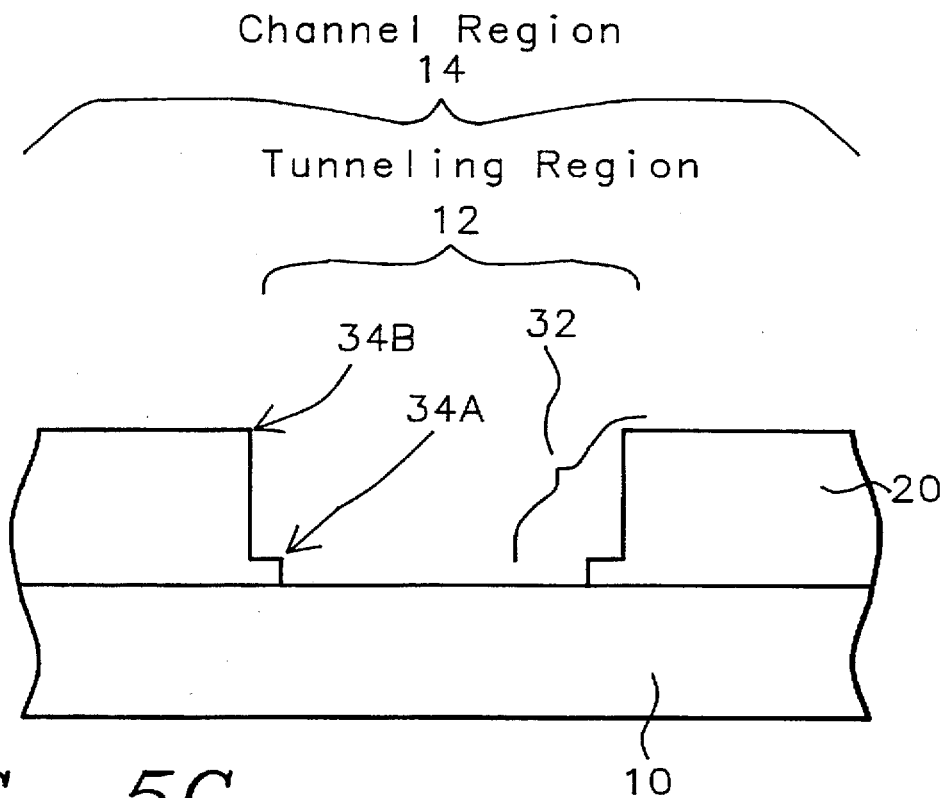

The second embodiment of the method where two steps 34a 34B are formed in the gate oxide layer 20 is shown in FIGS. 5A to 5C. As shown in figure 5a, a first oxide layer 20 is over a surface of a semiconductor substrate 10. The substrate has a channel region 14 which is part of a semiconductor memory device, especially an EEPROM. See FIG. 7.

A first photoresist layer 40 having a first photoresist opening 40a is formed over a portion of the channel region 14. The first opening preferably has an open dimension in a range of between about 0.08 and 2.0 µm.

Next, a first portion of the first oxide layer 20 is etched using the first photoresist opening as a mask thereby forming a first tunneling opening 35A defined by a first step 34A. The first tunneling opening preferably has an open dimension in a range of between about 0.3 and 0.7 µm and more preferably about 0.5 µm. The first tunneling opening can have any shape and more preferably has a rectangular shape.

As shown in FIG. 5B, a second photoresist layer 42 having a second photoresist opening 42A is formed over a portion of the channel region 14. The second photoresist opening 42a preferably has an open dimension larger than the first photoresist opening 40A.

Still referring to figure 5b, the first oxide layer 20 is etched through a portion of the second photoresist opening 42A forming a second tunneling opening exposing the channel region and forming a second step 34B. The second tunneling opening has an open dimension larger than the first tunneling opening. The second step 34B preferably has height in a range of between about 20 and 100 Å and a width in a range of between about 100 Å and 0.5 µm. The critical dimension of each step (for the width) is larger than the alignment accuracy. It is important that the critical dimension of each step (for the width) is larger than the alignment accuracy. This is because both sides of the tunnel window have steps and a misalignment error on one side makes the steps on the other side bigger or smaller. The width of the steps are important and should be greater than 100 Å.

As shown in FIG. 5c, the substrate is oxidized forming a tunnel oxide layer 30 over the channel region 14. The tunneling oxide preferably has a thickness in a range of between about 50 and 150 Å and more preferably about 100 Å. The oxide thinning edge effect is eliminated by the first step 34A. After the tunnel oxidation process (FIG. 5C), the first step preferably has a width in a range of between about 100 and 200 Å and more preferably of about 150 Å.

The first step reduces or eliminates the problems associated with the thin oxide effects. Subsequently, the semiconductor device, such as a memory can be made by using conventional steps in forming a gate structure as shown in FIG. 7.

Third Embodiment—Multiple Steps Photo Method

The third embodiment of the present invention forms more than two oxide steps (e.g., 34A 34B 34C, etc) around the tunnel oxide layer 30 to eliminate the thin oxide effect at the perimeter of the tunnel oxide. The process for forming the first and second steps 34A and 34B are the same as described above in the second embodiment.

Figure 6A:
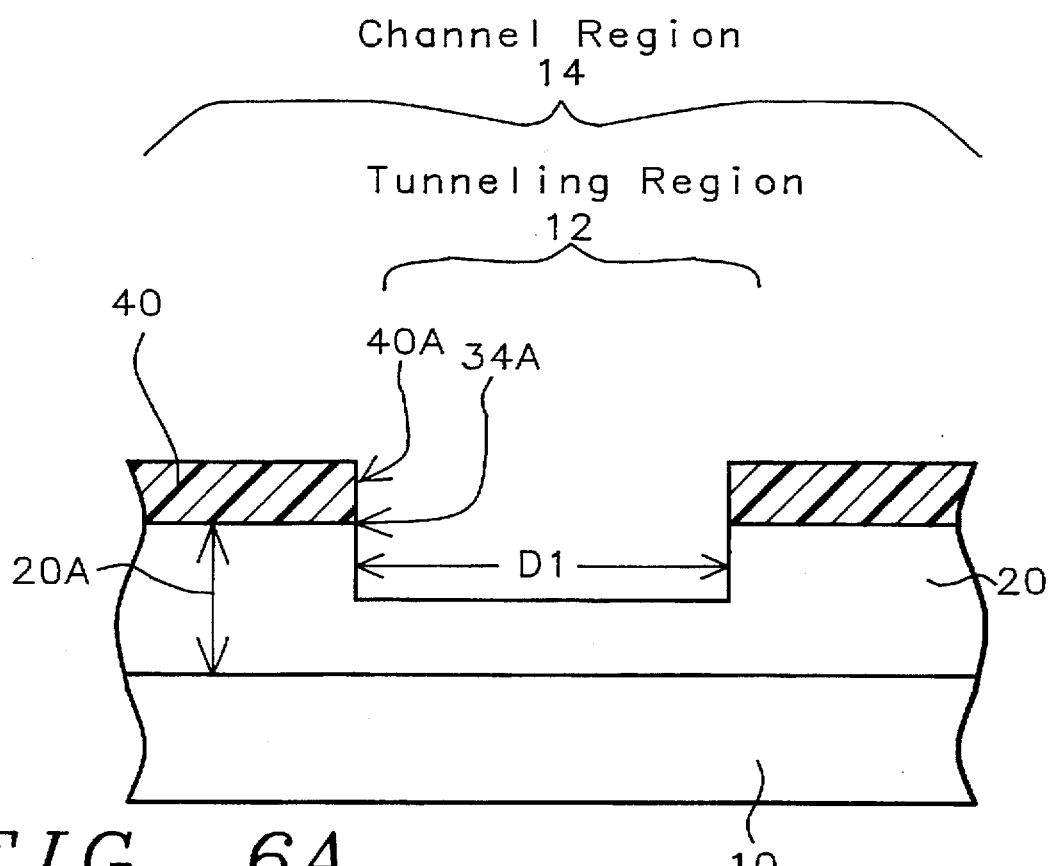
FIGS. 6A–6D are cross sectional views, for illustrating a step tunnel oxide structure having 2 or more steps according to the third embodiment of the present invention.

As shown in FIG. 6a, a first oxide layer (gate oxide layer) 20 is formed over a surface of a semiconductor substrate 10. The substrate having a channel region 14. The channel region is part of a semiconductor device similar to the device shown in FIG. 7.

A first photoresist layer 40 having a first photoresist opening 40A is formed over a portion of the channel region. The first oxide layer 20 is etched using the first photoresist opening as a mask forming a first tunneling opening 35A. The first tunneling opening has an open dimension of $D_1$.

Figure 6B:
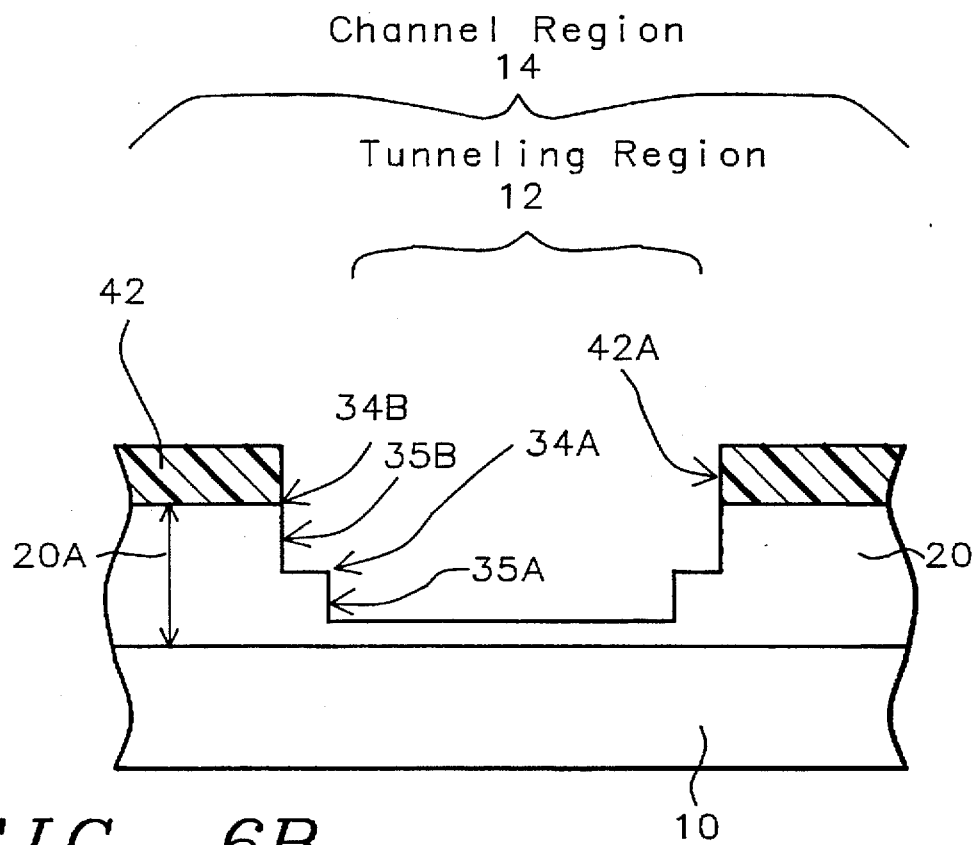

As shown in FIG. 6B, a second photoresist layer 42 having a second photoresist opening 42A is formed over a portion of the channel region 14. The second photoresist opening 42a preferably has an open dimension larger than the first photoresist opening 40A.

Still referring to FIG. 6b, the first oxide layer 20 is etched through a portion of the second photoresist opening 42A forming a second tunneling opening 35B exposing the channel region and forming a second step 34B. The second tunneling opening has an open dimension larger than the first tunneling opening and first photoresist opening 40A.

Figure 6C:
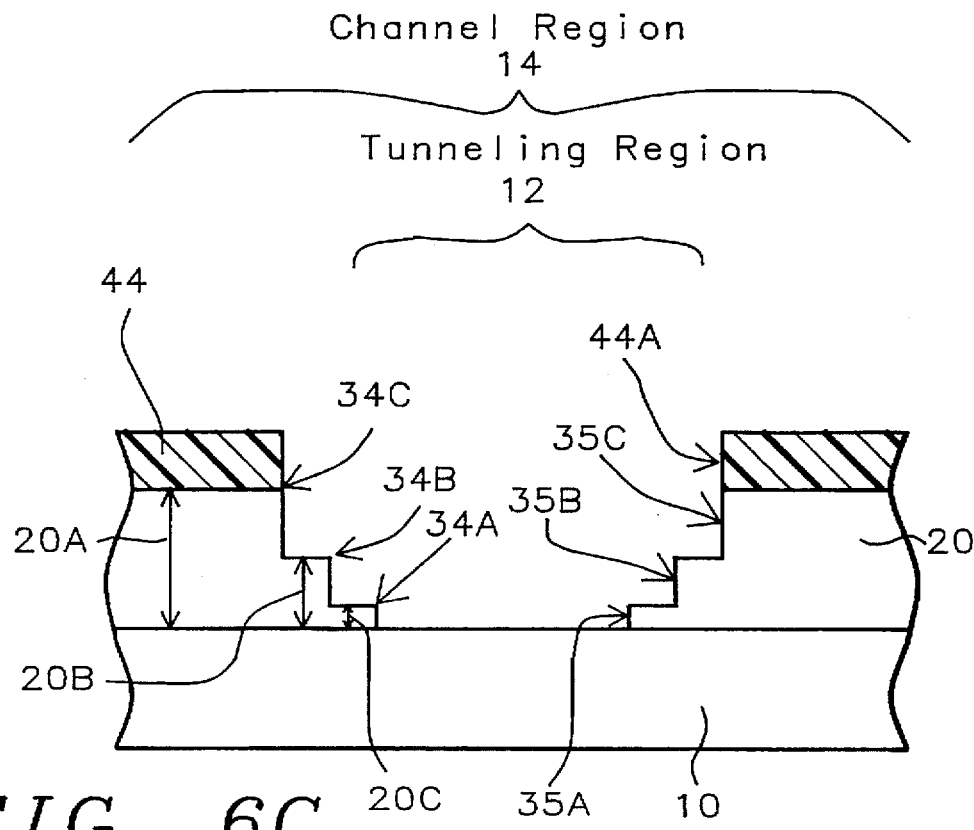

As shown in FIG. 6c, a third photoresist layer 44 having a third photoresist opening 44A is formed over the first oxide layer 20. The first oxide layer 30 is etched through the third photoresist opening 44A to form a third tunneling opening 35C exposing the channel region on the substrate and forming a third step 34C. The third tunneling opening has an open dimension larger than the second tunneling opening and second photoresist opening 40A.

Figure 6D:
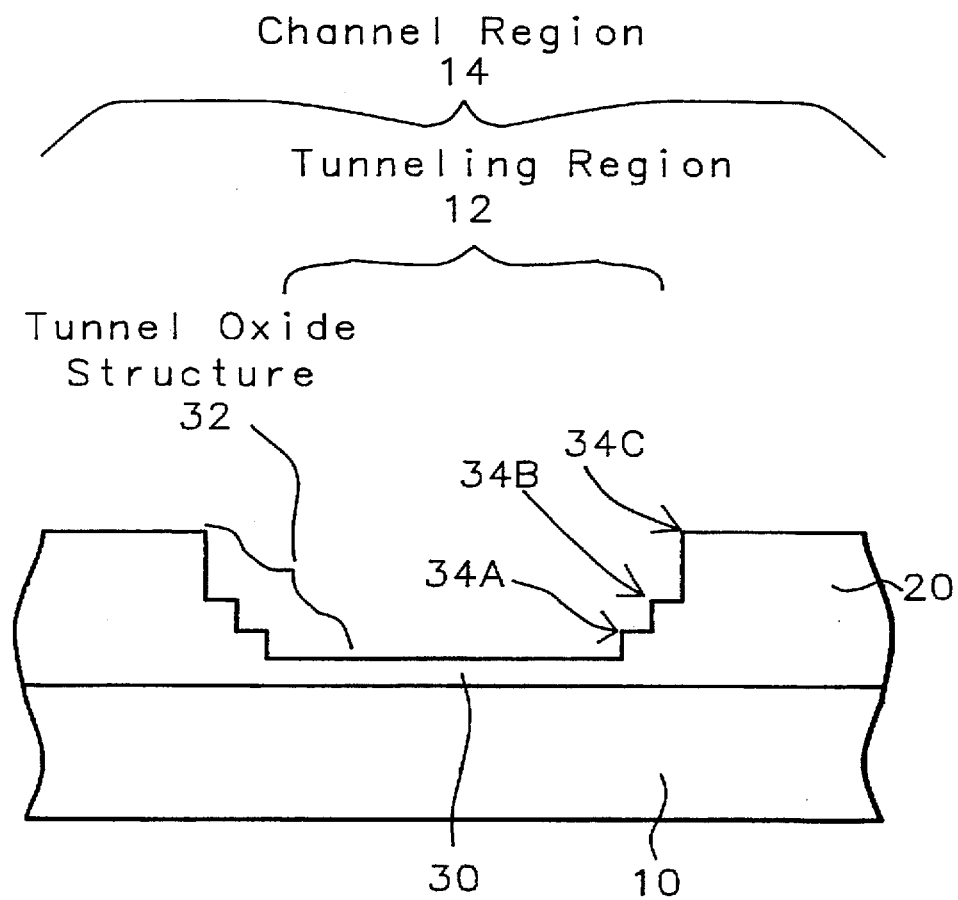

If three steps are desired, as shown in FIG. 6D, the substrate is oxidized forming a tunnel oxide layer 30 over the channel region 14. The oxide thinning edge effect is eliminated by the step 34A, 34B and 34C.

The process of forming steps (e.g., 34A, 34b, 34C, ... etc) as describe above (photo mask, & etch) can be repeated any number (n) of desired times and is more preferably repeated between 2 and 5 times. See FIG. 3. FIGS. 3 and 4 show an embodiment of the tunnel oxide steps of the invention having a desired "N" number of steps. FIG. 3 represents a tunnel oxide step structure 26. The structure of the present invention can have and desired number (n) of steps 26. The first step of the series of steps is labeled 22 and the group of n steps is labeled 26 in FIGS. 3 and 4. FIG. 4 is a top down view of the tunnel oxide step structure of the invention.

The process for forming (n) steps after the first step can be describe as follows. Afterward the first tunnel oxide opening 34a is formed, a subsequent photoresist layer, called a $n^{th}$ photoresist layer, having a $n^{th}$ photoresist opening is formed over a portion of the channel region.

The first oxide layer is etch through a portion of the nth photoresist opening forming a $n^{th}$ tunneling opening. The $n^{th}$ tunneling opening has an open dimension a smaller opening than the first tunneling opening and the previous tunnel oxide opening (n−1)th tunnel. To describe the subsequent steps, the $n^{th}$ tunneling opening is referred to as an existing tunneling opening (e.g., n−1 tunneling opening).

Afterward the photo masking steps and the etch step are repeated for a desired n times between 1 and 5 times, and more preferably between 2 and 3 times. Each $n^{th}$ photoresist layer having a nth photoresist opening smaller than the existing tunneling opening. The steps 34 preferably have a width 100 Å and 0.05 μm.

To complete the tunnel oxide step structure, a tunnel oxide layer 30 is formed over the exposed channel region and over the nth steps (34a, 34b, . . . 34n).

FIG. 7 shows the completed memory device having the tunnel oxide step structure 96 of the present invention. A gate structure is formed over the gate oxide 20, the steps 34 and the tunnel oxide 30. The gate structure is preferably composed of a stack formed upon the gate oxide layer, the stepped tunneling oxide structure 32 and the tunneling oxide layer 30. The stack preferably comprises a floating gate electrode 82, a dielectric layer 84 formed upon the floating gate electrode 82 and a control electrode 86 formed upon the dielectric layer. Other variations of the memory device structure can be formed over the tunnel oxide layer 30 and steps 34 as is apparent to those skilled in the art.

DESCRIPTION OF THE STRUCTURE OF THE INVENTION

The invention provides a description of the structure for the stepped tunnel oxide structure 32. The invention's stepped tunnel oxide structure can be describe as follows. The invention's stepped tunnel oxide structure can be incorporated into a self-aligned flash memory MOS field effect transistor device comprising: a silicon semiconductor substrate 10 having an upper surface. A source region 90 and a drain region 92 are formed in the substrate on the upper surface. A channel region 94 is between the source and drain regions. A tunneling region 96 is surrounded by the channeling region. A gate oxide layer 20, a stepped tunnel oxide structure and a tunnel oxide layer formed over the surface of the substrate including the surface over the source and the drain regions. The gate oxide layer surrounds the stepped tunnel oxide structure. The stepped tunnel oxide structure surrounds the tunnel oxide layer. The step oxide structure 32 can have any given (desired) number (n) of steps.

As shown in FIG. 7, the tunnel oxide structure 30 32 comprising a tunnel oxide layer 30 surrounded by a stepped tunnel oxide structure 32. The gate oxide layer 20 having a thickness greater than the thickness of the tunnel oxide layer 30. The stepped tunnel oxide structure 32 having n steps 34a 34b 34c where n is preferably between 1 and 5. The n steps having a thickness between the thicknesses of the gate oxide layer 20 and the tunnel oxide layer 30. A gate structure composed of a stack formed upon the gate oxide layer, the stepped tunneling oxide structure 32 and the tunneling oxide layer 30. The stack comprising a floating gate electrode 82, a dielectric layer 84 formed upon the floating gate electrode 82 and a control electrode 86 formed upon the dielectric layer.

The present invention provides a structure and a method of forming a stepped trench oxide structure for a semiconductor memory device. The stepped tunnel oxide structure can have 2 or more steps. The stepped trench oxide structure has "oxide steps" in the gate oxide surrounding the tunnel oxide where the oxide steps are formed where the oxide thinning effect normally thins the tunnel oxide. The oxide steps compensate for the oxide thinning effect and eliminate the problems associated with the oxide thinning effects.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a tunnel oxide layer for a memory device comprising the steps of:

a) forming a first oxide layer over a surface of a semiconductor substrate; said substrate having a channel region; said substrate having a tunneling region surrounded by said channel region;

b) forming a first photoresist layer having a first photoresist opening over a portion of said channel region;

c) etching a first portion of said first oxide layer through said first photoresist opening at least over said tunneling region exposing said substrate forming a first tunneling opening;

d) forming a second oxide layer over said exposed substrate and said first oxide layer;

e) forming a second photoresist layer over said second oxide layer; said second photoresist layer having a second photoresist opening; said second photoresist opening is smaller than said first photoresist opening; said second photoresist opening exposing said tunneling region;

f) etching said second oxide layer through said second opening exposing said substrate surface and forming a first step;

g) forming a third oxide layer over said exposed substrate, said first oxide layer and said second oxide layer; thereby propagating said first step and whereby the oxide thinning edge effect is eliminated by said first step.

2. The method of claim 1 which further includes said first photoresist opening is defined by a first exposure through a first photolithography optical mask; said second photoresist opening is defined by a second exposure through said first photolithography optical mask; said second exposure is longer than said first exposure thereby said second photoresist opening is smaller than said first photoresist opening.

3. The method of claim 1 wherein said first oxide layer has a thickness in a range of between about 25 and 150 Å.

4. The method of claim 1 wherein said second oxide layer has a thickness in a range of between about 25 and 75 Å.

5. The method of claim 1 wherein said second photoresist opening is smaller than said first photoresist opening by between about 0.02 and 0.07 µm.

6. The method of claim 1 wherein said third oxide layer has a thickness in a range of between about 40 and 125 Å.

7. The method of claim 1 wherein said first step has a width in a range of between about 0.02 µm and 0.07 µm and a height between about 115 and 155 Å.

8. A method of fabricating a tunnel oxide layer for a memory device; comprising the steps of:

a) forming a first oxide layer over a surface of a semiconductor substrate; said substrate having a channel region; said substrate having a tunneling region surrounded by said channel region;

b) forming a first photoresist layer having a first photoresist opening over a portion of said channel region; said first photoresist opening defined by a first exposure through a first photolithography optical mask;

c) etching said first oxide layer through said first photoresist opening at least over said tunneling region exposing said substrate forming a first tunneling opening;

d) forming a second oxide layer over said exposed substrate and said first oxide layer;

e) forming a second photoresist layer over said second oxide layer; said second photoresist layer having a second photoresist opening; said second photoresist opening is smaller than said first photoresist opening; said second photoresist opening exposing said tunneling region; said second photoresist opening is smaller than said first photoresist opening by a distance of between about 0.02 and 0.07 µm; said second photoresist opening is defined by a second exposure through said first photolithography optical mask; said second exposure is longer than said first exposure thereby said second photoresist opening is smaller than said first photoresist opening;

f) etching said second oxide layer through said second opening exposing said substrate surface and forming a first step;

g) forming a third oxide layer over said exposed substrate, said first oxide layer and said second oxide layer; thereby propagating said first step and whereby the oxide thinning edge effect is eliminated by said first step; said first step has a width in a range of between about 0.02 µm and 0.07 µm and more preferably about 0.05 µm and a height between about 115 and 155 Å and more preferably of about 125 Å.

9. The method of claim 8 wherein said second oxide layer has a thickness in a range of between about 25 and 75 Å.

10. The method of claim 8 wherein said first oxide layer has a thickness in a range of between about 25 and 150 Å.

11. The method of claim 8 wherein said third oxide layer has a thickness in a range of between about 40 and 125 Å.

12. A method of fabricating a tunnel oxide layer for a memory device; comprising the steps of:

a) forming a first oxide layer over a surface of a semiconductor substrate; said substrate having a channel region;

b) etching a portion of said first oxide layer forming a first tunneling opening and first step;

c) etching said first oxide layer forming a second tunneling opening exposing said channel region and forming a second step, said second tunneling opening having an open dimension larger than said first tunneling opening;

d) oxidizing said substrate forming a tunnel oxide layer over said channel region whereby the oxide thinning edge effect is eliminated by said step.

13. The method of claim 1 wherein said first tunneling opening has an open dimension in a range of between about 0.3 and 1.0 µm .

14. The method of claim 1 wherein said first step has a width in a range of between about 100 Å and 0.5 µm.

15. A method of fabricating a tunnel oxide layer for a memory device; comprising the steps of:

a) forming a first oxide layer over a surface of a semiconductor substrate; said substrate having a channel region;

b) forming a first photoresist layer having a first photoresist opening over a portion of said channel region;

c) etching a first portion of said first oxide layer said first photoresist opening forming a first tunneling opening;

d) forming a second photoresist layer having a second photoresist opening over a portion of said channel region; said second photoresist opening having an open dimension larger than said first photoresist opening;

e) etching said first oxide layer through a portion of said second photoresist opening forming a second tunneling opening exposing said channel region and forming a second step, said second tunneling opening having an open dimension larger than said first tunneling opening;

f) oxidizing said substrate forming a tunnel oxide layer over said channel region whereby the oxide thinning edge effect is eliminated by said step.

* * * * *